United States Patent
Mitra et al.

(10) Patent No.: US 12,169,435 B2
(45) Date of Patent: Dec. 17, 2024

(54) DYNAMIC SELF-CORRECTION OF MESSAGE RELIABILITY IN LDPC CODES

(71) Applicant: Intel Corporation, Santa Clara, CA (US)

(72) Inventors: Debarnab Mitra, Los Angeles, CA (US); Zion S. Kwok, Burnaby (CA); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 17/171,430

(22) Filed: Feb. 9, 2021

(65) Prior Publication Data

US 2021/0165712 A1 Jun. 3, 2021

(51) Int. Cl.
*G06F 11/10* (2006.01)
*H03M 13/11* (2006.01)

(52) U.S. Cl.
CPC ..... *G06F 11/1068* (2013.01); *H03M 13/1108* (2013.01); *H03M 13/1114* (2013.01); *H03M 13/1171* (2013.01)

(58) Field of Classification Search
CPC .......... G06F 11/1068; H03M 12/1108; H03M 12/1114; H03M 12/1171
See application file for complete search history.

(56) References Cited

U.S. PATENT DOCUMENTS

2022/0085829 A1* 3/2022 Asadi .................. H03M 13/096

OTHER PUBLICATIONS

Declercq, David et al., "Extended MinSum Algorithm for Decoding LDPC Codes over GF(q)", IEEE International Symposium on Information Theory, pp. 464-468, Sep. 2005.
Kim, Sangmin, "Improved Trellis-Based Decoder for Non-Binary LDPC Codes", IEEE International Conference on Computing, Networking and Communications (ICNC), pp. 1-5, Feb. 2016.
Li, Erbao et al., "Trellis-Based Extended Min-Sum Algorithm for Non-Binary LDPC Codes and its Hardware Structure", IEEE Transactions on Communications, vol. 61, No. 7, Jul. 2013, 12 pgs.
Savin, Valentin, "Self-Corrected Min-Sum decoding of LDPC codes", IEEE International Symposium on Information Theory, pp. 146-150, 2008.
Boutillon, Emmanuel et al., "Hardware Design and Realization for Iteratively Decodable Codes", <https://perso-etis.ensea.fr/declercq/Elsevier/Chapter13_HardwareDesign_Boutillon/implementation_chapter.pdf>, Nov. 27, 2013, 101 pgs.

* cited by examiner

*Primary Examiner* — Samir W Rizk
(74) *Attorney, Agent, or Firm* — Essential Patents Group, LLP

(57) ABSTRACT

An embodiment of an electronic apparatus comprises one or more substrates, and logic coupled to the one or more substrates, the logic to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability. Other embodiments are disclosed and claimed.

20 Claims, 11 Drawing Sheets

DYNAMIC SELF-CORRECTION OF MESSAGE RELIABILITY IN LDPC CODES

BACKGROUND

A low density parity-check (LDPC) code refers to a linear error correcting code which may be applied to error-prone data, such as transmission of data over a noisy channel, storage of data in memory that is subject to defects in the media, etc. LDPC technology may involve construction of a particular type of bipartite graph referred to as a Tanner graph. Non-binary LDPC (NB-LDPC) may provide better decoding performance as compared to binary LDPC for moderate code lengths, but with higher complexity. An Extended MM-Sum (EMS) decoder may provide a NB-LDPC decoder that reduces the complexity of the check node processing unit compared to a non-binary belief propagation decoder by using limited number of values of the log-density ratio (LDR) messages. A Trellis-based Extended MM-Sum (TEMS) decoder may provide a NB-LDPC decoder that may be hardware implementable with lower decoding latency as compared to the EMS decoder by using a greater degree of hardware parallelization. An improved TEMS (ImprovedTEMS) decoder modifies the TEMS decoder to improve its raw bit error rate (RBER) performance using an alternate message update scheme during the check node processing. A self-corrected MM-Sum decoder for binary LDPC codes provides a modification to a binary MM-Sum decoder with improved RBER performance.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
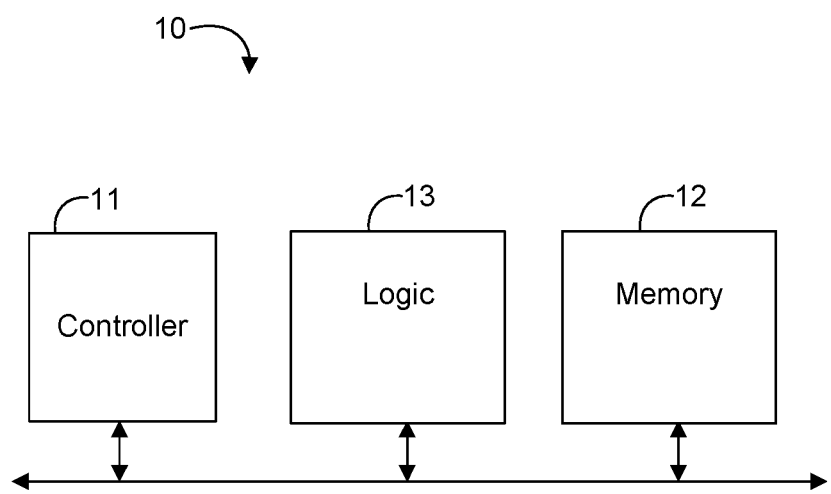
FIG. 1 is a block diagram of an example of an electronic system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; flash memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a byte addressable memory device, such as a three dimensional (3D) crosspoint memory device, or other byte addressable write-in-place nonvolatile memory devices. In one embodiment, the memory device may be or may include memory devices that use chalcogenide glass, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of an electronic system 10 may include a controller 11, memory 12, and logic 13 communicatively coupled to the controller 11 and the memory 12. The logic 13 may be configured to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability. For example, the logic 13 may be configured to increase a reliability factor of reliable messages sent from the check nodes to the variables nodes and keep unreliable messages sent from the check nodes to the variables nodes unchanged to reduce the influence of the unreliable messages sent from the check nodes to the variable nodes, and/or to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

In some embodiments, the logic 13 may be further configured to calculate a first message to be sent from a first check node to a first variable node in association with the error correction operation, determine a first reliability confidence value for the first message, and adjust a value of the first message based on the determined first reliability confidence value. The logic 13 may also be configured to calculate a second message to be sent from a second variable node to a second check node in association with the error correction operation, determine a second reliability confidence value for the second message, and adjust a value of the second message based on the determined second reliability confidence value. For example, the logic 13 may be configured to compare respective current hard decision values of the calculated first and second messages with corresponding prior hard decision values from a previous iteration to determine the respective first and second reliability confidence values. In some embodiments, the error correction operation may correspond to a non-binary low density parity check (NB-LDPC) operation, and the reliability factor may correspond to a log-density ratio (LDR) reliability value. Alternatively, in some embodiments the error correction operation may correspond to a binary low density parity check (LDPC) operation, and the reliability factor may correspond to a log-likelihood ratio (LLR) reliability value.

Embodiments of each of the above controller 11, memory 12, logic 13, and other system components may be implemented in hardware, software, or any suitable combination thereof. For example, hardware implementations may include configurable logic such as, for example, programmable logic arrays (PLAs), FPGAs, complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the memory 12, the logic 13, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as RAM, ROM, programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the memory 12, persistent storage media, or other system memory may store a set of instructions which when executed by the controller 11 cause the system 10 to implement one or more components, features, or aspects of the system 10 (e.g., the logic 13, detecting the unreliable messages, determining the degrees of unreliability for the unreliable messages, reducing the influence of the unreliable messages on the error correction operation based on the degrees of unreliability, etc.).

Figure 2:
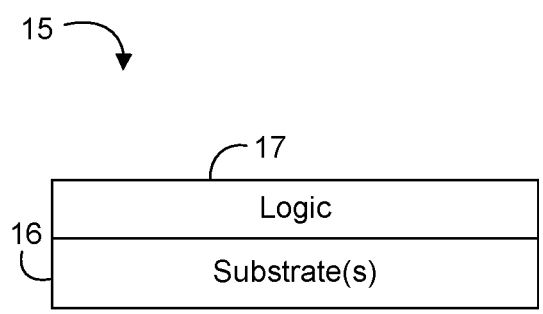
FIG. 2 is a block diagram of an example of an electronic apparatus according to an embodiment.

With reference to FIG. 2, an embodiment of an electronic apparatus 15 may include one or more substrates 16, and logic 17 coupled to the one or more substrates 16. The logic 17 may be configured to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability. For example, the logic 17 may be configured to increase a reliability factor of reliable messages sent from the check nodes to the variables nodes and keep unreliable messages sent from the check nodes to the variables nodes unchanged to reduce the influence of the unreliable messages sent from the check nodes to the variable nodes, and/or to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

In some embodiments, the logic 17 may be further configured to calculate a message to be sent from a check node to a variable node in association with the error correction operation, determine a reliability confidence value for the message, and adjust a value of the message based on the determined reliability confidence value. Additionally, or alternatively, the logic 17 may be configured to calculate a message to be sent from a variable node to a check node in association with the error correction operation, determine a reliability confidence value for the message, and adjust a value of the message based on the determined reliability confidence value.

In some embodiments, the logic 17 may be further configured to calculate a first message to be sent from a first check node to a first variable node in association with the error correction operation, determine a first reliability confidence value for the first message, adjust a value of the first message based on the determined first reliability confidence value, calculate a second message to be sent from a second variable node to a second check node in association with the error correction operation, determine a second reliability confidence value for the second message, and adjust a value of the second message based on the determined second reliability confidence value. For example, the logic 17 may be configured to compare respective current hard decision values of the calculated first and second messages with corresponding prior hard decision values from a previous iteration to determine the respective first and second reliability confidence values. In some embodiments, the error correction operation may correspond to a non-binary low density parity check (NB-LDPC) operation, and the reliability factor may correspond to a log-density ratio (LDR) reliability value. Alternatively, in some embodiments the error correction operation may correspond to a binary low density parity check (LDPC) operation, and the reliability factor may correspond to a log-likelihood ratio (LLR) reliability value.

Embodiments of the logic 17 may be implemented in a system, apparatus, computer, device, etc., for example, such as those described herein. For example, the logic 17 may be incorporated in a LDPC module as part of a memory system, a storage system, a transmission system, or any system or device where LDPC technology is beneficial. More particularly, hardware implementations of the logic 17 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the logic 17 may be implemented on a semiconductor apparatus, which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Figure 3A:
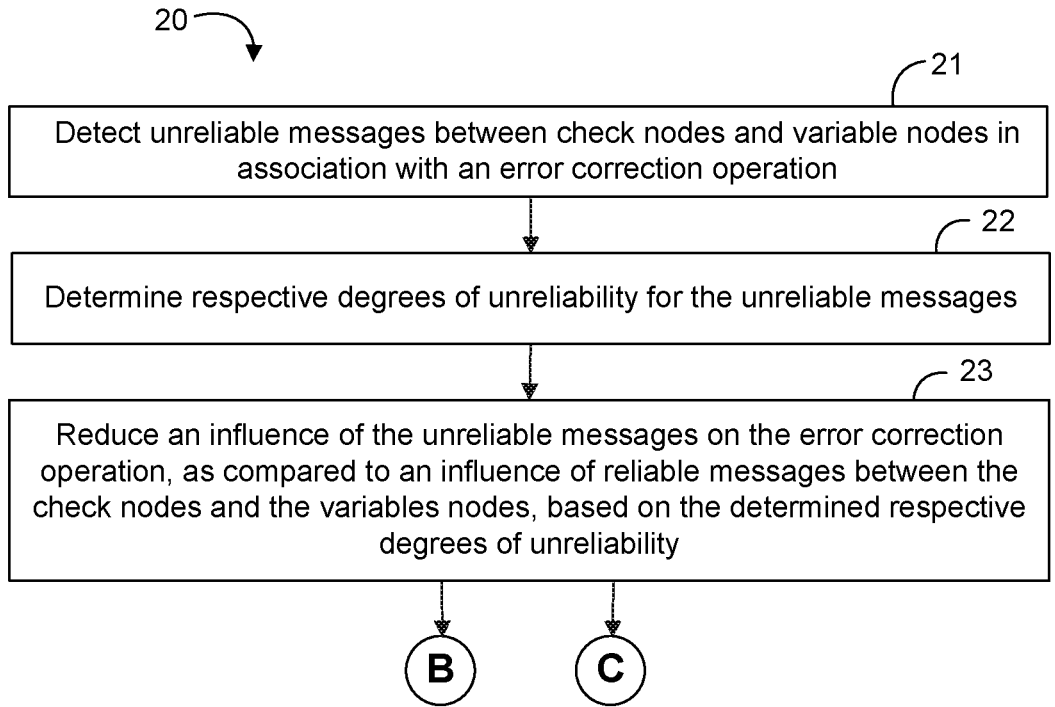
FIGS. 3A to 3C are flowcharts of an example of a method of controlling memory according to an embodiment.
Figure 3B:
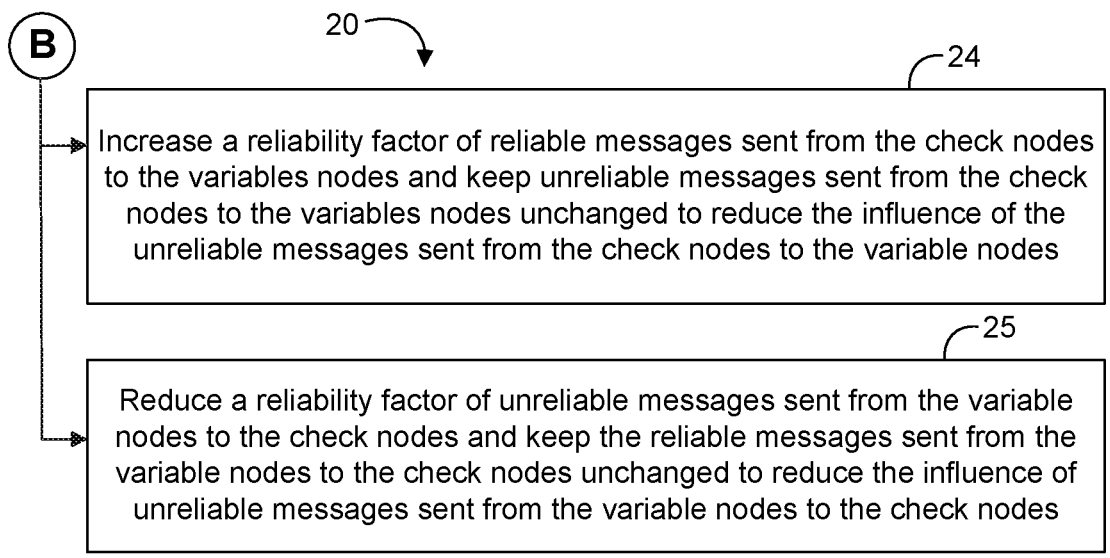
Figure 3C:
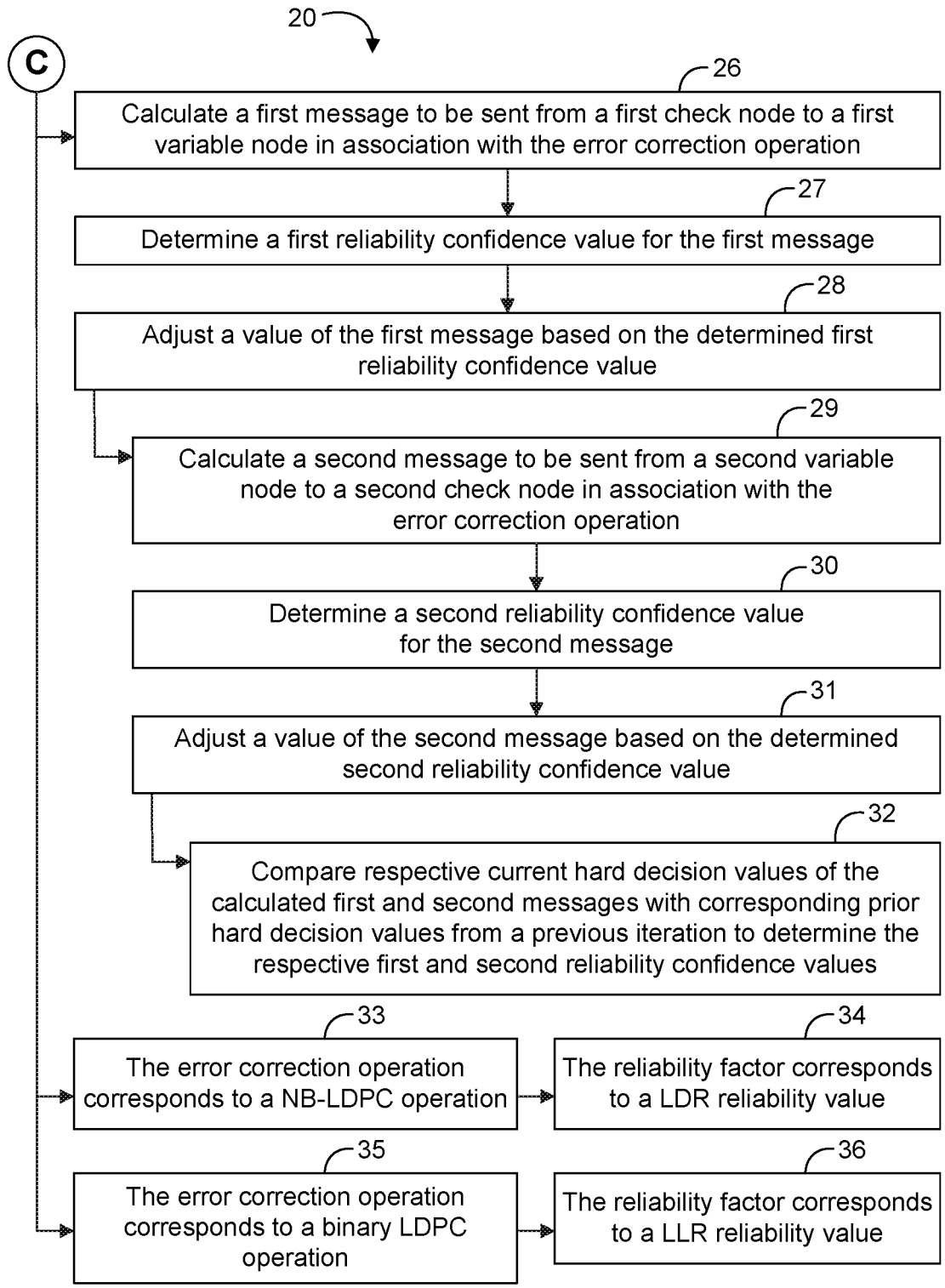

Turning now to FIGS. 3A to 3C, an embodiment of a method 20 of controlling memory may include detecting unreliable messages between check nodes and variable nodes in association with an error correction operation at block 21, determining respective degrees of unreliability for the unreliable messages at block 22, and reducing an influence of the unreliable messages on the error correction operation, as compared to an influence of reliable messages between the check nodes and the variables nodes, based on the determined respective degrees of unreliability at block 23. For example, the method 20 may include increasing a reliability factor of reliable messages sent from the check nodes to the variables nodes and keep unreliable messages sent from the check nodes to the variables nodes unchanged to reduce the influence of the unreliable messages sent from the check nodes to the variable nodes at block 24, and/or reducing a reliability factor of unreliable messages sent from the variable nodes to the check nodes and keep the reliable messages sent from the variable nodes to the check nodes unchanged to reduce the influence of unreliable messages sent from the variable nodes to the check nodes at block 25.

Some embodiments of the method 20 may further include calculating a first message to be sent from a first check node to a first variable node in association with the error correction operation at block 26, determining a first reliability confidence value for the first message at block 27, and adjusting a value of the first message based on the determined first reliability confidence value at block 28. The method 20 may also include calculating a second message to be sent from a second variable node to a second check node in association with the error correction operation at block 29, determining a second reliability confidence value for the second message at block 30, and adjusting a value of the second message based on the determined second reliability confidence value at block 31. For example, the method 20 may further include comparing respective current hard decision values of the calculated first and second messages with corresponding prior hard decision values from a previous iteration to determine the respective first and second reliability confidence values at block 32.

In some embodiments, the error correction operation may correspond to a NB-LDPC operation at block 33, and the reliability factor may correspond to a LDR reliability value at block 34. Alternatively, in some embodiments the error correction operation may correspond to a binary LDPC operation at block 35, and the reliability factor may correspond to a LLR reliability value at block 36.

Embodiments of the method 20 may be implemented in a system, apparatus, computer, device, etc., for example, such as those described herein. More particularly, hardware implementations of the method 20 may include configurable logic such as, for example, PLAs, FPGAs, CPLDs, or in fixed-functionality logic hardware using circuit technology such as, for example, ASIC, CMOS, or TTL technology, or any combination thereof. Hybrid hardware implementations include static dynamic System-on-Chip (SoC) re-configurable devices such that control flow, and data paths implement logic for the functionality. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the method 20 may be implemented on a computer readable medium. Embodiments or portions of the method 20 may be implemented in firmware, applications (e.g., through an application programming interface (API)), or driver software running on an OS. Additionally, logic instructions might include assembler instructions, instruction set architecture (ISA) instructions, data set architecture (DSA) commands, (machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, Moore Machine, Mealy Machine, etc.).

Some embodiments may advantageously provide technology for dynamic self-correction of message reliability in Trellis-Extended Min-Sum decoding for improved performance of NB-LDPC codes. Error-correcting codes based on the binary alphabet are inferior to the NB-LDPC codes in terms of their respective correction strength. NB-LDPC codes achieve higher raw bit error rate (RBER) performance compared to binary LDPC codes at moderate code lengths, at the expense of higher decoding complexity. Some conventional non-binary decoder technology is not practical to be implemented in hardware (e.g., due to high complexity and area cost) and has a problem of high decoding latency. For example, a non-binary belief propagation decoder (e.g., sometimes referred to as a Q-ary Sum product algorithm) has high hardware complexity making use thereof infeasible for high throughput and low latency applications (e.g., such as non-volatile memory systems). The Trellis-based Extended MM-Sum (TEMS) decoder and its improved variant (ImprovedTEMS) are described as reducing the decoding complexity for NB-LDPC codes (e.g., lower hardware cost as compared to the non-binary belief propagation decoder), making these decoders potentially practical to be implemented in hardware. While reducing the hardware cost as compared to the non-binary belief propagation decoder, however, the TEMS decoder variants suffer from a loss in error correction performance.

Some embodiments advantageously provide technology for a low complexity strategy to improve RBER performance (e.g., as compared to the ImprovedTEMS decoder) at very low additional hardware cost. Embodiments provide technology that may be utilized to improve the RBER performance of any NB-LDPC decoder that propagates LDR messages in the decoding process (e.g., such as the Extended MM-Sum decoder, other variants of the TEMS decoder, etc.). As described in further detail below, embodiments may also be utilized with binary LDPC decoders that propagate LLR messages during the decoding process (e.g., such as the MM-Sum decoder, etc.). Some embodiments may advantageously provide NB-LDPC technology for advanced memory systems such as INTEL OPTANE memory technology, etc., where faster error correction may be beneficial.

In iterative message passing decoders (e.g., such as belief propagation, TEMS, etc.), LDR messages are sent back and forth between check nodes (CNs) and variable nodes (VNs) in a Tanner Graph (TG) arrangement. An embodiment of a NB-LDPC decoder may improve the RBER performance (e.g., as compared to an ImprovedTEMS decoder) with technology that, at each iteration of the decoding algorithm, dynamically adjusts (self-corrects) the CN to VN (c2v) messages and the VN to CN (v2c) messages based on a reliability confidence of the calculated c2v and v2c messages. For example, the reliability confidence of the messages is determined by comparing the hard decision values of the calculated c2v and v2c messages with the corresponding hard decisions of the messages in the previous iteration of the NB-LDPC decoder. Advantageously, some embodiments may provide a significant RBER performance improvement and a substantial frame error rate (FER) improvement of as compared to the ImprovedTEMS decoder. Embodiments of technology described herein may facilitate error-correction schemes with superior correctability and relatively low complexity. Error correction codes with improved RBER correction may be particularly beneficial to advanced memory technologies (e.g., media with lower yields, higher costs, etc.). For example, the improvement in RBER may enable memory media (e.g., 3D crosspoint, etc.) to attain higher yields earlier. The FER improvement potentially may reduce the annualized failure rate (AFR) related to the random media uncorrectable errors substantially.

Binary LDPC codes may achieve Shannon capacity for very long codeword lengths. However, binary LDPC codes are disadvantageous when the application demands (i) high throughput and low latency transmission requiring short codeword lengths, (ii) high reliability transmission requiring very low frame error rates (typically below FER=$10^{-14}$). NB-LDPC codes are a generalization of binary LDPC codes defined on larger order Galois fields GF(q). Each non-zero entry of the parity check matrix of the code is carefully chosen from the elements of GF(q). At moderate codeword lengths, NB-LDPC codes can achieve significant RBER performance gain compared to their binary counterparts. However, this improved performance comes at the cost of increased decoding complexity using the optimal non-binary belief propagation decoder, bottlenecking the implementation of NB-LDPC codes in hardware.

One reason for the high complexity of the decoder is the complexity associated with the check node operation which scales as O(qlogq). The TEMS decoder reduces the complexity of the check node operation enough to be hardware feasible, and the ImprovedTEMS decoder improves the RBER performance of the TEMS decoder with and similar hardware complexity. Even with the RBER performance gain with the ImprovedTEMS decoder, however, the loss incurred due to the approximate check node operation is not suitable for applications requiring very low FERs. Some embodiments provide low complexity technology to further improve the RBER performance (e.g., as compared to the ImprovedTEMS decoder) by dynamically adjusting the message reliabilities of the iterative decoder, thereby enabling use of a NB-LDPC decoder efficiently in hardware to meet the target FER requirements of a wider range of applications.

Without being limited to theory of operation, one reason for the loss of performance of the ImprovedTEMS decoder may be due to the overestimation of the messages by the approximate check node operation. The overestimation may lead to the flow of unreliable information (e.g., both v2c and c2v messages) during the message passing process resulting in a performance degradation. This unreliable information changes from iteration to iteration. Advantageously, some embodiments may provide technology for dynamic self-correction that (1) detects this unreliable information that flows during the message passing decoding; and (2) after the unreliable messages are detected, reduces the relative influence of the unreliable messages, as compared to other reliable information that may propagate during the decoding process, depending on the degree of the unreliability determined at (1).

Detection of Unreliable v2c and c2v Messages

Figure 4:
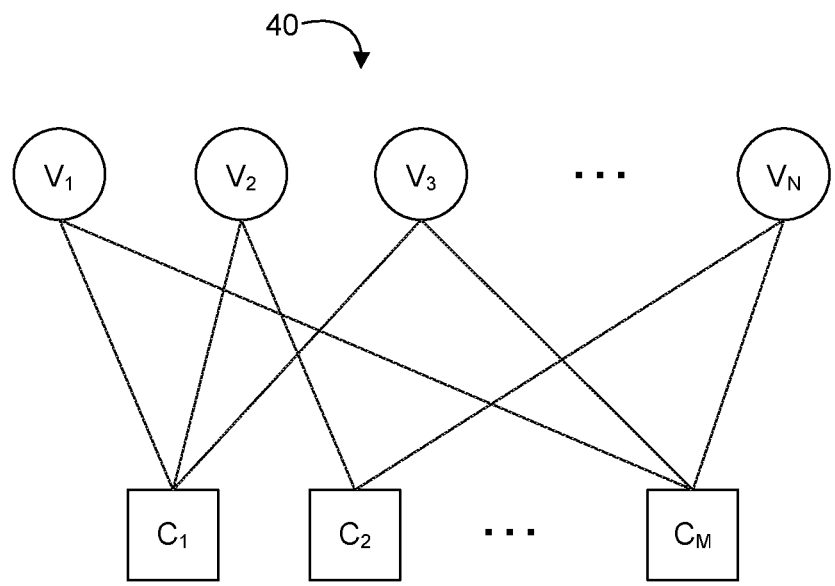
FIG. 4 is a block diagram of an example of a Tanner graph according to an embodiment.

With reference to FIG. 4, an embodiment of a Tanner graph 40 includes a plurality of variable nodes $V_1$ through $V_N$ interconnected with a plurality of check nodes $C_1$ through $C_M$, where N and M are both positive integers and N is not necessarily the same as M. The lines between the variables nodes and the check nodes are referred to as edges of the Tanner graph 40. To detect if a v2c message (equivalently for c2v messages) that passes on an edge of the Tanner graph 40 during a particular iteration of the decoding process is unreliable, some embodiments first compute the hard decision value of this v2c message (i.e., the GF(q) index that corresponds to the maximum LDR value in the v2c LRD message vector). Then the computed hard decision value is compared with the hard decision of the v2c message on the same edge during the previous iteration of the decoder. If the hard decisions match, the message is deemed to be reliable. If the hard decisions do not match, the v2c message (equivalently, a c2v message) is deemed to be unreliable and an adjustment is made to the v2c message to reduce the relative influence of this unreliable message.

Figure 5:
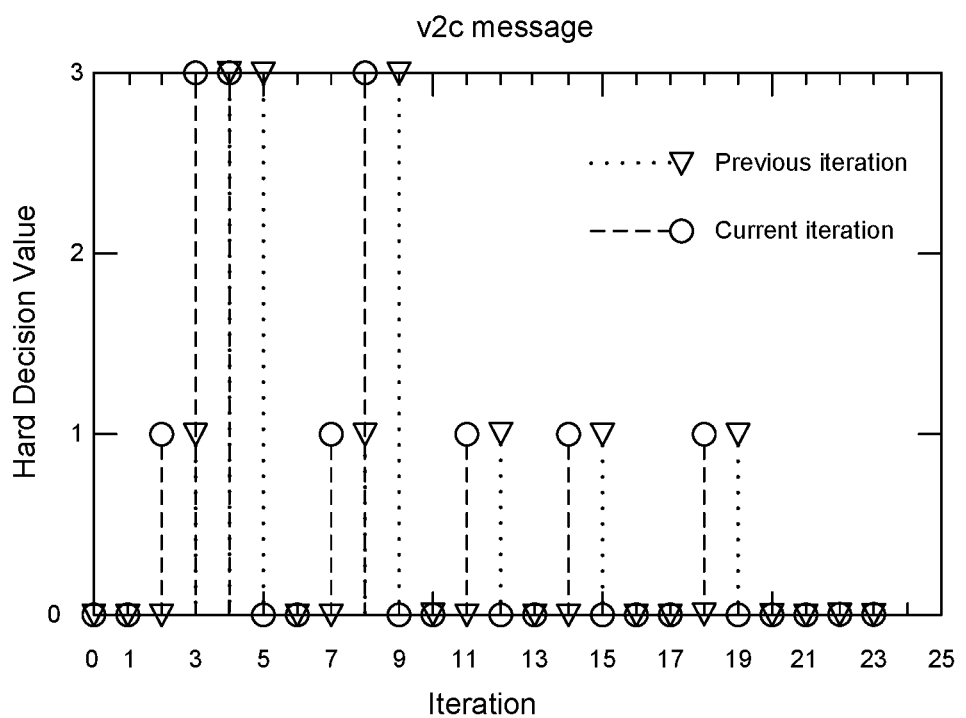
FIG. 5 is an example graph of hard decision value versus iteration according to an embodiment.

With reference to FIG. 5, an illustrative graph shows how the hard decision value fluctuate for a v2c message on a particular edge of a Tanner graph on different iterations of an embodiment of a NB-LDPC decoder. As illustrated, the hard decision values of the v2c messages at the current and previous iteration vary with the iteration number, and the hard decision values do not match at iteration numbers 2, 3, 5, 7, 8, 9, 11, 12, 14, 15, 18, and 19. In accordance with some embodiments, the v2c messages at these iterations are detected as unreliable and the unreliable messages are adjusted to reduce the relative influence of the unreliable messages based on the degree of the unreliability (e.g., the difference between the hard decision values).

In some embodiments, the degree of unreliability of a message is based on the number of bits difference corresponding to the hard decision values of the current and the previous iteration. Accordingly, as illustrated in FIG. 5, at iteration 5 and 9, the number of bits difference is 2 and at iterations 2, 3, 7, 8, 11, 12, 14, 15, 18 and 19 the number of bits difference is 1. For a conventional ImprovedTEMS decoder, a significant fraction of the messages sent from the variable nodes to the check nodes are unreliable, which leads to the performance degradation. Embodiments of a NB-LDPC decoder with dynamic self-correction technology detect the unreliable messages sent from the variable nodes to the check nodes and adjust the unreliable messages to reduce the relative influence of the unreliable messages based on the degree of the unreliability, advantageously improving performance.

Reduction of Relative Influence of Unreliable v2c Messages

The LDR reliability of a message may correspond to the difference between the maximum and the second maximum LDR values in a message LDR vector. In the following description, the LDR reliability may be also denoted as delta ("Δ"). For v2c messages, in some embodiments, the relative influence of unreliable v2c messages is reduced by reducing the LDR reliability of these unreliable messages, keeping the reliable v2c messages as is without any change. The LDR reliability of a v2c message is reduced by reducing the gap between the LDR values at the indices that correspond to the maximum and the second maximum LDR values in the LDR vector.

For example, the gap may be reduced as follows. Because the LDR value at index 0 of the LDR vector is always 0, if the index corresponding to the maximum LDR value in the message is 0, the gap may be decreased by adding to all non-maximum LDR values. As an approximation, in some embodiments, the gap is decreased by adding to the LDR value at the index corresponding to the second maximum LDR, a scaled down version of Δ. If the index corresponding to the maximum LDR value in the message is other than 0, the gap is reduced by subtracting the scaled down version of Δ from the LDR value at the index corresponding to this maximum. Δ is scaled down by different amounts based on the degree of unreliability of the unreliable v2c message (e.g., as determined by the number of bits difference corresponding to the hard decision values of the current and the previous iteration).

Figure 6:
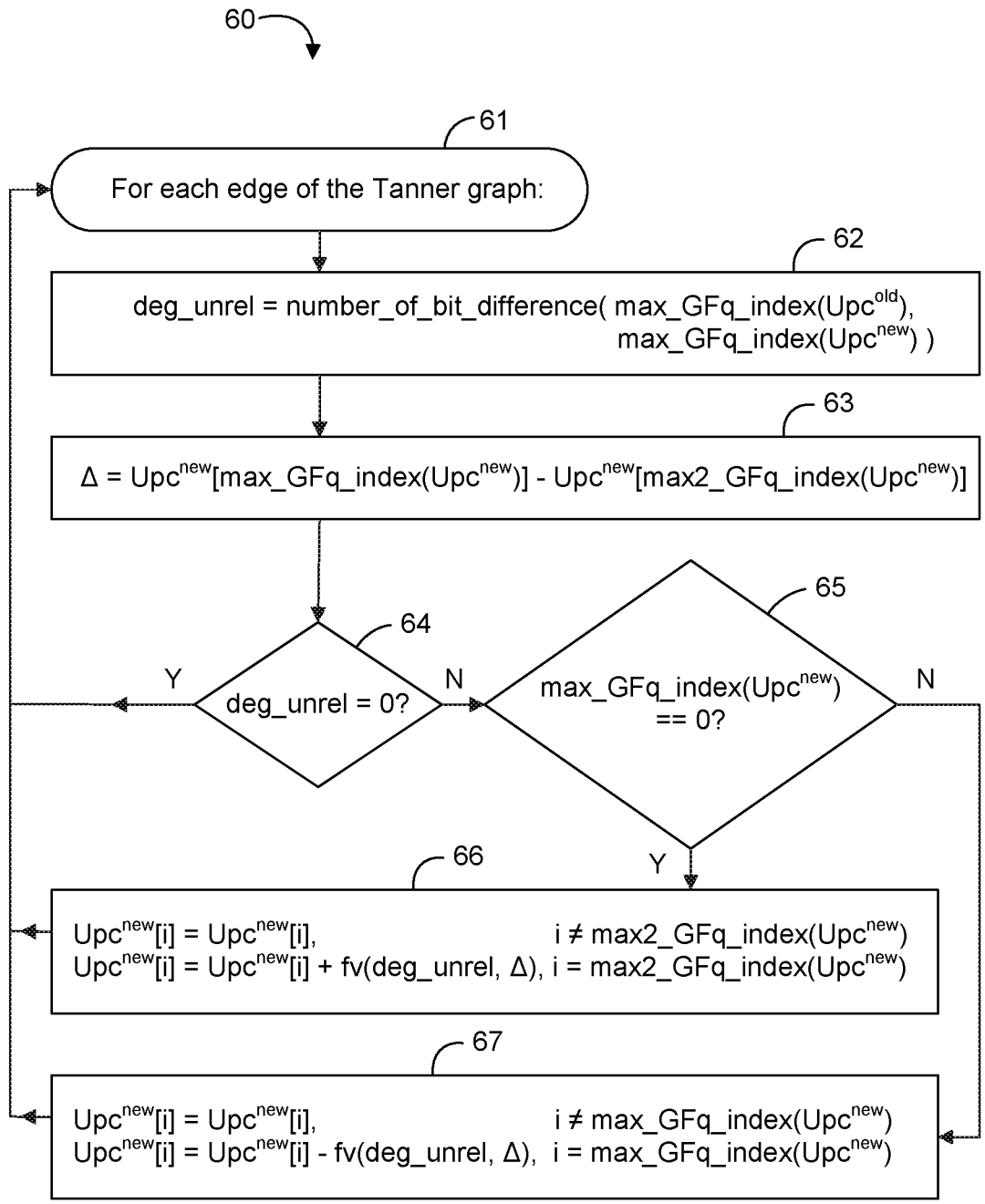
FIG. 6 is a flow chart of an example of a process flow according to an embodiment.

With reference to FIG. 6, an embodiment of process flow 60 provides dynamic self-correcting technology for detecting and reducing the relative influence of unreliable v2c messages. For a particular edge of a Tanner graph, the newly calculated v2c message is referred to as $Upc^{new}[\beta]$, $\beta \in GF(q)$ and $Upc^{old}[\beta]$, $\beta \in GF(q)$ refers to the v2c message on the same edge in the previous iteration of the decoding algorithm. Procedures max_GFq_index( ) and max2_GFq_index( ) determine the indices of the maximum and second maximum value in the input LDR vector. Procedure number_of_bit_difference(x, y) determines the number of bit difference between GF(q) indices x and y. If the number of bit difference is zero, the hard decision values are considered to match. An example of v2c message self-correction pseudo-code follows (where the index i ranges all the GF(q) indices):

```
<block 61>  For each edge of the Tanner graph:
<block 62>      deg_unrel = number_of_bit_difference(max_GFq_index(Upc^old),
                            max_GFq_index(Upc^new) )
<block 63>      Δ = Upc^new[max_GFq_index(Upc^new)]
                    - Upc^new[max2_GFq_index(Upc^new)]
<block 64>      If deg_unrel = 0
                    <return to block 61> // make no change to Upc^new
                Else // the message Upc^new is unreliable and its reliability is reduced
<block 65>          If max_GFq_index(Upc^new) == 0
<block 66>              Upc^new[i] = Upc^new[i], i ≠ max2_GFq_index(Upc^new)
                        Upc^new[i] = Upc^new[i] + fv(deg_unrel, Δ),
                                i = max2_GFq_index(Upc^new)
                    Else
<block 67>              Upc^new[i] = Upc^new[i], i ≠ max_GFq_index(Upc^new)
                        Upc^new[i] = Upc^new[i] - fv(deg_unrel, Δ),
                                i = max_GFq_index(Upc^new)
                    End If
                End If
    End For
``` where fv(deg_unrel, Δ) is a scaled version of Δ that depends on the number of bit difference between the hard decision values of the current (new) and the old v2c message. For example, an embodiment of fv(deg_unrel, Δ) may be expressed as:

$$fv(\text{deg\_unrel}, \Delta) = \begin{cases} 0.2\,\Delta, & \text{deg\_unrel} = 1 \\ 0.5\,\Delta, & \text{deg\_unrel} = 2 \end{cases} \quad \text{Eq. (1)}$$

The process flow 60 maintains LDR=0 for index 0. Other embodiments of a decoder may function properly without maintaining LDR=0 for index 0. For example, only the size of the gaps between the LDRs may matter. Note that the LDRs may be normalized before or after the adjustment of the unreliability values.

In the process flow 60, instead of using multiplicative scaling of Δ similar to equation (1), a general additive/subtractive term fv(deg_unrel, Δ) may be used which also depends of Δ. In accordance with some embodiments, any function fv(deg_unrel, Δ) that potentially reduces the gap between the LDR values at the indices that correspond to the maximum and the second maximum LDR values in the v2c message vector Upc^new, may be used in the dynamic v2c message self-correction with proper tuning. For example, another example fv(deg_unrel, Δ) for the v2c message self-correction also provides RBER performance improvements:

$$fv(\text{deg\_unrel}, \Delta) = \begin{cases} 1, & \Delta > 1, \text{deg\_unrel} = 1,2 \\ \Delta, & \Delta \le 1, \text{deg\_unrel} = 1,2 \end{cases} \quad \text{Eq. (2)}$$

Reduction of Relative Influence of Unreliable c2v Messages

For c2v messages, some embodiments reduce the relative influence of unreliable c2v messages by increasing the LDR reliability of the reliable c2v messages, keeping the unreliable c2v messages as is without any change. The LDR reliability of reliable c2v messages is increased by increasing the gap between the LDR values at indices that correspond to the maximum and the second maximum LDR values in the LDR vector. The gap is increased in a manner similar to unreliable v2c messages. Namely, if the index corresponding to the maximum LDR value in the c2v message is 0, the gap is increased by subtracting to the LDR value at indices other than the index corresponding to the maximum LDR, a scaled down version of Δ. If the index corresponding to the maximum LDR value in the message is other than 0, the gap is increased by adding the scaled down version of Δ from the LDR value at the index corresponding to this maximum. Δ is scaled down by different amounts based on the degree of unreliability of the unreliable c2v message.

Figure 7:
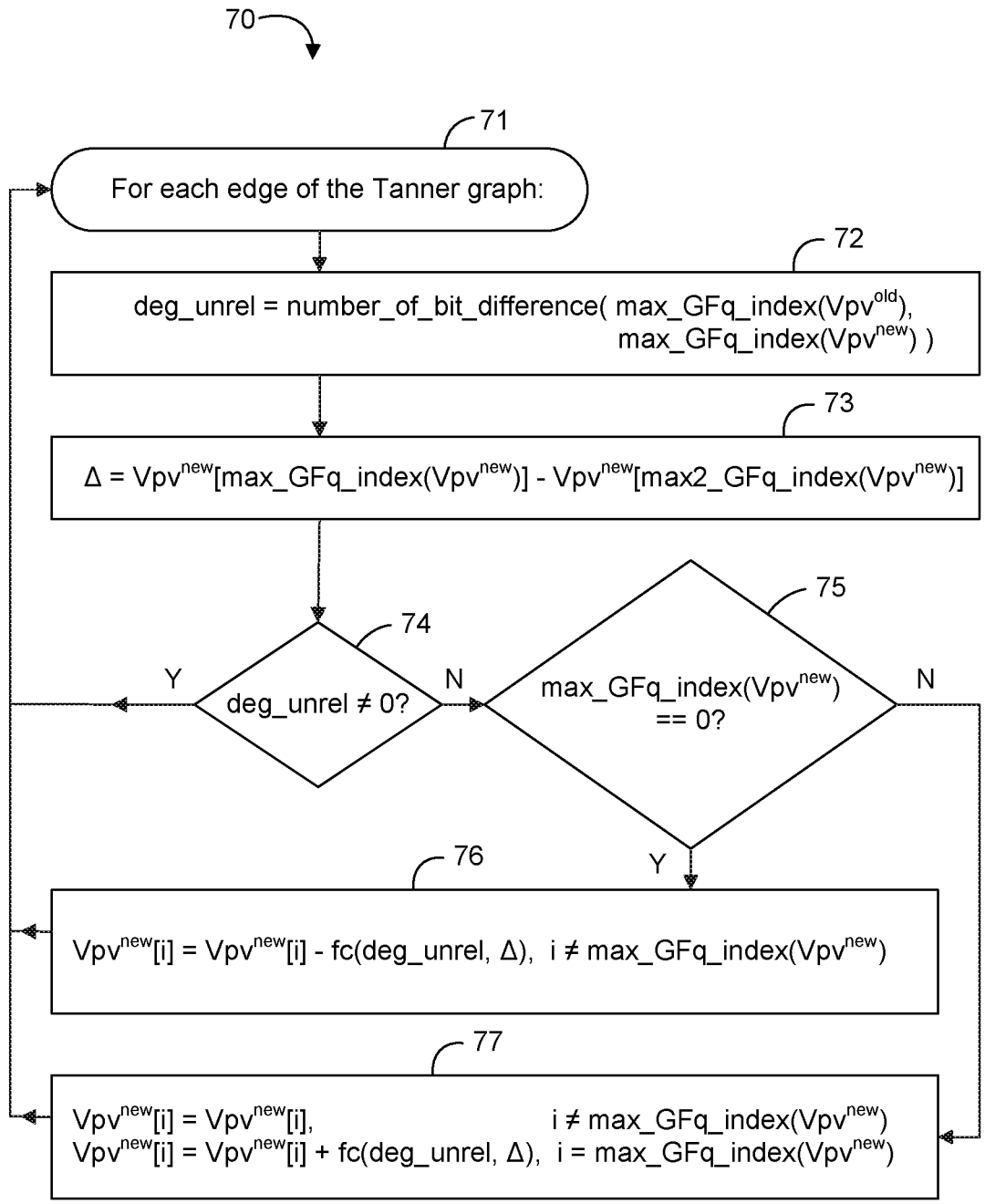
FIG. 7 is a flow chart of another example of a process flow according to an embodiment.

With reference to FIG. 7, an embodiment of process flow 70 provides dynamic self-correcting technology for detecting and reducing the relative influence of unreliable c2v messages. For a particular edge of the Tanner graph, the newly calculated c2v message is referred to as Vpv^new[β], β ∈ GF(q) and Vpv^old[β], β ∈ GF(q) refers to the c2v message on the same edge in the previous iteration of the decoding algorithm. Other notations are the same as noted above. An example of c2v message self-correction pseudo-code follows (where the index i ranges all the GF(q) indices):

```
<block 71>   For each edge of the Tanner graph:
<block 72>       deg_unrel = number_of_bit_difference(max_GFq_index(Vpv^old),
                             max_GFq_index(Vpv^new) )
<block 73>       Δ = Vpv^new[max_GFq_index(Vpv^new)] -
                     Vpv^new[max2_GFq_index(Vpv^new)]
<block 74>       If deg_unrel ≠ 0
                     <return to block 71> // make no change to Vpv^new
                 Else // the message Vpv^new is reliable and its reliability is increased
<block 75>           If max_GFq_index(Vpv^new) == 0
<block 76>               Vpv^new[i] = Vpv^new[i] - fc(deg_unrel, Δ) ,
                                 i ≠ max_GFq_index(Vpv^new)
                     Else
<block 77>               Vpv^new[i] = Vpv^new[i], i ≠ max_GFq_index(Vpv^new)
                         Vpv^new[i] = Vpv^new[i] + fc(deg_unrel, Δ),
```

```
            End If
                    i = max_GFq_index(Vpv^{new})
         End If
   End If
End For
```

Similar to the v2c message case, fc(deg_unrel, Δ) is a scaled version of Δ that depends on the number of bit difference between the hard decisions of the current (new) and the old c2v message. For example, an embodiment of fc(deg_unrel, Δ) may be expressed as follows:

$$fc(\text{deg\_unrel}, \Delta) = \frac{\Delta}{7}, \text{deg\_unrel} = 1,2. \quad \text{Eq. (3)}$$

Note that the reliability of unreliable v2c messages is decreased (keeping the reliable v2c messages as is) whereas the reliability of reliable c2v messages is increased (keeping the unreliable c2v messages as is) instead of decreasing the reliability of unreliable messages c2v messages. This ensures that on the same edge of the tanner graph, the gap reduction operation is not performed multiple times, which would result in diminishing returns. The dynamic self-correction operation can also be performed in a reverse way by increasing the reliability of reliable v2c messages (keeping the unreliable v2c messages as is) and decreasing the reliability of unreliable c2v messages (keeping the reliable c2v messages as is) to get similar RBER performance improvements.

Advantageously, an ImprovedTEMS decoder modified to include embodiments of the dynamic self-correction technology described herein shows performance improvements. The percentage of unreliable messages sent by the variable nodes significantly reduces, resulting in performance improvements. Embodiments of technology for detection of unreliable c2v and v2c messages and reduction of their relative influence can be applied to other NB-LDPC decoders that pass LDR messages back and forth between the CNs and VNs during the decoding process, such as an EMS decoder or other variants of the TEMS decoder, to improve their RBER and/or FER performance.

Figure 8A:
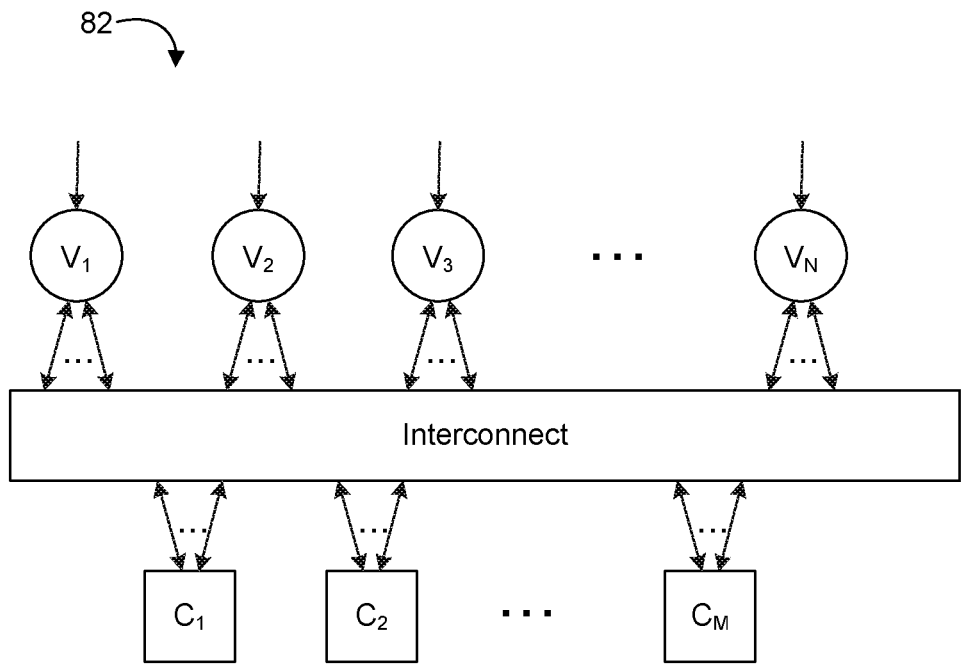
FIGS. 8A to 8C are block diagrams of respective decoder architecture according to embodiments.
Figure 8B:
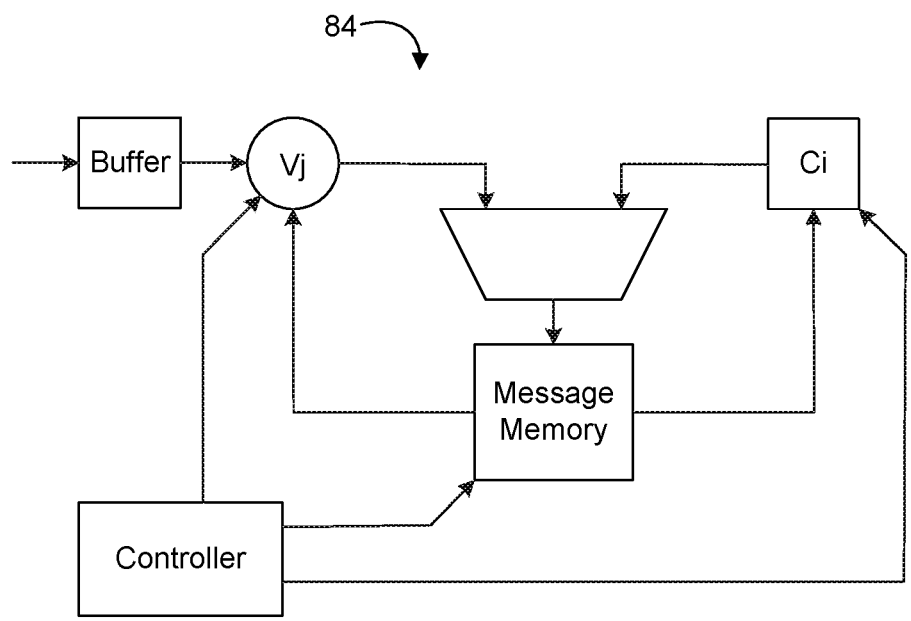
Figure 8C:
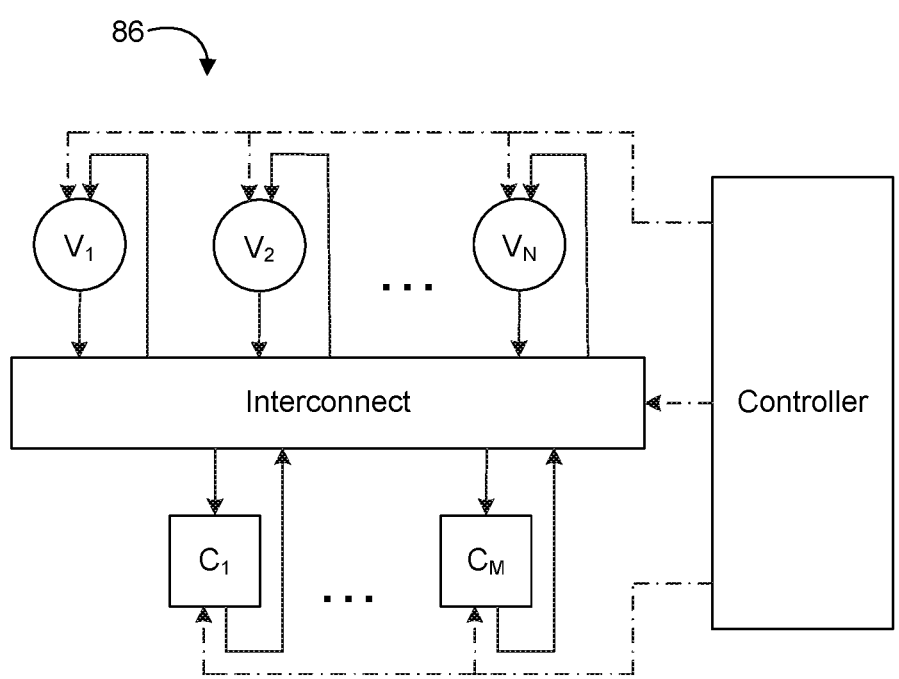

Any suitable architecture of a NB-LDPC decoder may be utilized with the dynamic self-correction technology described herein. Non-limiting example architectures include a highly parallel NB-LDPC decoder 82 (FIG. 8A), a highly serial NB-LDPC decoder 84 (FIG. 8B), and a partially parallel, layered NB-LDPC decoder 86 (FIG. 8C). The decoders 82, 84, and 86 each include one or more CNs (Ci, i=1 . . . M) and VNs (Vj, j=1 . . . N), together with various memory, interconnect, and/or control elements coupled as illustrated. The computational architecture may resemble or be adapted to the structure of a Tanner graph. The CNs and VNs themselves may be processing elements (e.g., execution units) and the memory, interconnects, and control units may be configured to support exchange of messages between graph nodes.

In the highly parallel decoder 82 (FIG. 8A), all or most nodes of the Tanner graph are separate processing elements that may be served concurrently. The interconnect is configured to provide each CN to VN edge in the Tanner graph. At each iteration, each VN receives an LDR from the channel, together with a number of c2v messages, arriving from a set of CNs. Generated v2c messages are sent back to the CNs. The two-phase decoding technique for NB-LDPC codes splits each iteration in two separated, non-overlapped parts where 1) the VNs receive input messages from the CNs and compute new messages to be sent back to CNs; and 2) the CNs receive messages from the VNs and generate new messages forwarded to VNs. Each of the VNs and CNs may include multiplication (permutation) logic/functionality to multiply the c2v and v2c messages by respective GF(q) elements. In accordance with some embodiments, the VNs and the CNs of the decoder 82 may be configured to detect unreliable messages between the CNs and the VNs in association with the NB-LDPC operation, determine respective degrees of unreliability for the unreliable messages, and reduce an influence of the unreliable messages on the NB-LDPC operation based on the determined respective degrees of unreliability. For example, the decoder 82 may be configured to implement one or more of the features described herein, including the process flow 60 (FIG. 6) and the process flow 70 (FIG. 7).

In the highly serial decoder 84 (FIG. 8B), the controller may be the only processing element, or the VN unit and CN unit may also be processing elements, and the nodes of the Tanner graph are served based on time multiplexing. As illustrated in FIG. 8B, the decoder 84 includes a controller, a single CN element, a single VN element, a buffer, and a message memory. After LDRs of a frame are loaded into the buffer, the controller orchestrates the decoding to complete a first half of the iteration (e.g., VN to CN), where the VN reads from the message memory, performs a message computation, and writes the computed messages back to the message memory. The controller then orchestrates the decoding to complete a second half of the iteration (e.g., CN to VN), where the CN reads from the message memory, performs a message computation, and writes the computed messages back to the message memory. In some implementations, the indices i and j may not directly address the message memory. Instead, the controller may include an address generator to store and retrieve the messages to/from the message memory. In accordance with some embodiments, the controller, the VN, and the CN of the decoder 84 may be configured to detect unreliable messages between the CNs and the VNs in association with the NB-LDPC operation, determine respective degrees of unreliability for the unreliable messages, and reduce an influence of the unreliable messages on the NB-LDPC operation based on the determined respective degrees of unreliability. For example, the decoder 84 may be configured to implement one or more of the features described herein, including the process flow 60 (FIG. 6) and the process flow 70 (FIG. 7).

In the partially parallel decoder 86, a number of the VNs and CNs may be separate processing elements, the number of processing elements is less than the number of nodes in the Tanner graph. Accordingly, multiple nodes share a VN/CN and the controller multiplexes a portion of the decoding operation. The partially parallel decoder 86 provides different cost/throughput trade-offs, depending on the number of processing elements and the complexity of the interconnect. Permutation networks with acceptable complexity can be used to support VN/CN communication for multiple LDPC codes. The interconnect may be configured to support the desired complexity from a fully flexible network (e.g., capable of supporting any parity check matrix) to lower complexity structures (e.g., for a specific class of codes). Examples of fully flexible solutions include Benes networks, application-specific networks on chip (NoCs), etc. In accordance with some embodiments, the controller, the VN, and the CN of the decoder 86 may be configured to detect unreliable messages between the CNs and the VNs in association with the NB-LDPC operation, determine respective degrees of unreliability for the unreliable messages, and reduce an influence of the unreliable messages on the NB-LDPC operation based on the determined respective degrees of unreliability. For example, the decoder 86 may be configured to implement one or more of the features described herein, including the process flow 60 (FIG. 6) and the process flow 70 (FIG. 7).

Dynamic Self-Correction for Binary LDPC Decoders:

The dynamic self-correction technology described herein can be also be applied to binary LDPC decoders to provide RBER improvements. In a binary LDPC decoder such as a Min-Sum decoder, instead of the LDR messages, log-likelihood ratio (LLR) messages are sent as the v2c and c2v messages. The sign of the LLR messages is similar to the hard decision values of the LDR messages in the non-binary case.

For detection of unreliable v2c and c2v messages in a binary LDPC decoder, a v2c message (equivalently for c2v messages) that passes on an edge of the Tanner graph during a particular iteration of the decoding process is considered unreliable if the sign of the v2c message (equivalently for c2v messages) is different than the sign of the v2c message on the same edge during the previous iteration of the decoder. Similar to the non-binary self-correction strategy described before, the relative influence of the unreliable v2c and c2v messages are reduced as described below.

For reduction of a relative influence of unreliable v2c and c2v messages in a binary LDPC decoder, the LLR reliability of a message may correspond to the absolute value of the LLR message, and may also be denoted below as "$\Delta$". For v2c messages, similar to the non-binary case, the relative influence of unreliable v2c messages is reduced by reducing the LLR reliability of the unreliable v2c messages, keeping the reliable v2c messages as is without any change. The LLR reliability of a v2c message is reduced by reducing the absolute value of the LLR message.

Figure 9:
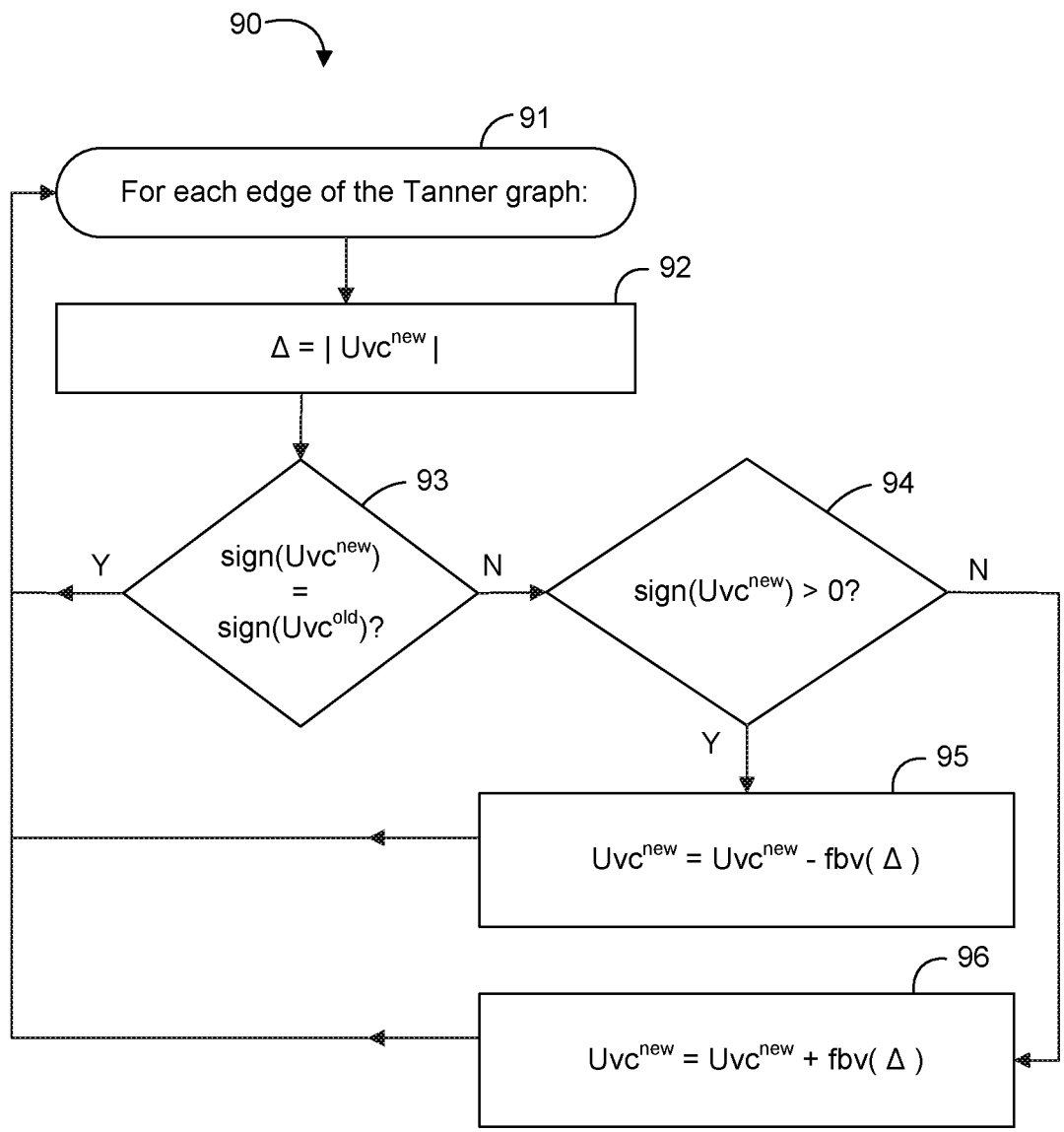
FIG. 9 is a flow chart of another example of a process flow according to an embodiment.

With reference to FIG. 9, an embodiment of process flow 90 provides dynamic self-correcting technology for detecting and reducing the relative influence of unreliable v2c messages in a binary LDPC decoder. For a particular edge of the Tanner graph, the newly calculated v2c LLR message is referred to as $Uvc^{new}$ and $Uvc^{old}$ refers to the v2c LLR message on the same edge in the previous iteration of the decoding algorithm. As used herein, "sign(x)" denotes the sign of the LLR message, where 0 is assumed to have positive sign and |x| denote the absolute value of x. An example of pseudo-code for v2c message self-correction for binary case is as follows:

```
<block 91>  For each edge of the Tanner graph:
<block 92>      Δ = | Uvc^new |
<block 93>      If sign(Uvc^new) = sign(Uvc^old)
                    <return to block 91> // make no change to Uvc^new
                Else // the message Uvc^new is unreliable and its reliability is reduced
<block 94>          If sign(Uvc^new) > 0
<block 95>              Uvc^new = Uvc^new − fbv( Δ )
                    Else
<block 96>              Uvc^new = Uvc^new + fbv( Δ )
                    End If
                End If
            End For
``` where $fbv(\Delta)$ is a scaled version of $\Delta$. For example, blocks 94, 95 and 96 may be equivalent to multiplying by a scaling factor that is between 0 and 1. Similar to the non-binary dynamic self-correcting technology, any additive/subtractive term which is positive and depends on $\Delta$ that reduces the absolute value of the v2c LLR message $Uvc^{new}$ can be used with proper tuning as $fbv(\Delta)$.

Figure 10:
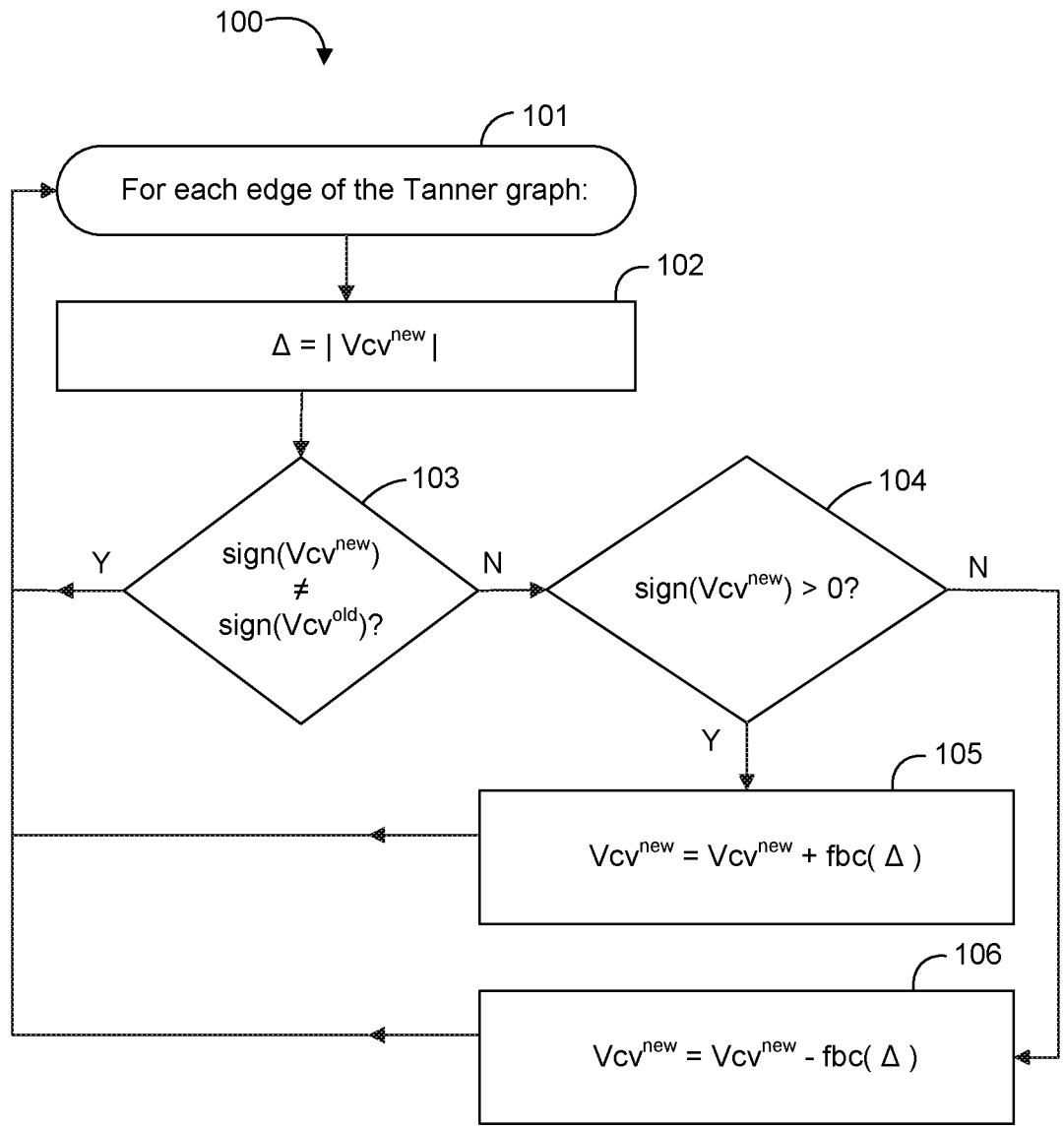
FIG. 10 is a flow chart of another example of a process flow according to an embodiment.

With reference to FIG. 10, an embodiment of process flow 100 provides dynamic self-correcting technology for detecting and reducing the relative influence of unreliable c2v messages in a binary LDPC decoder. For c2v messages, similar to the non-binary case, the relative influence of unreliable c2v messages is reduced by increasing the LLR reliability of the reliable c2v messages, keeping the unreliable c2v messages as is without any change. The LLR reliability of a c2v message is reduced by reducing the absolute value of the LLR message. For a particular edge of the Tanner graph, the newly calculated c2v LLR message is referred to as $Vcv^{new}$ and $Vcv^{old}$ refers to the c2v LLR message on the same edge in the previous iteration of the decoding algorithm. Other notations are the same as noted above. An example pseudo-code for c2v message self-correction for the binary case is as follows:

```
<block 101>  For each edge of the Tanner graph:
<block 102>      Δ = | Vcv^new |
<block 103>      If sign(Vcv^new) ≠ sign(Vcv^old)
                     <return to block 101> // make no change to Vcv^new
                 Else // the message Vcv^new is reliable and its reliability is increased
<block 104>          If sign(Vcv^new ) > 0
<block 105>              Vcv^new = Vcv^new + fbc( Δ )
                     Else
<block 106>              Vcv^new = Vcv^new − fbc( Δ )
```

```
        End If
    End If
End For
```

Similar to the non-binary case, fbc(Δ) is a scaled version of Δ. For example, blocks 104, 105, and 106 may be equivalent to multiplying by a scaling factor that is greater than 1. Note that the dynamic self-correction operation can also be performed by increasing the reliability of reliable v2c messages (keeping the unreliable v2c messages as is) and decreasing the reliability of unreliable c2v messages (keeping the reliable c2v messages as is), similar to the non-binary dynamic self-correction technology.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 11:
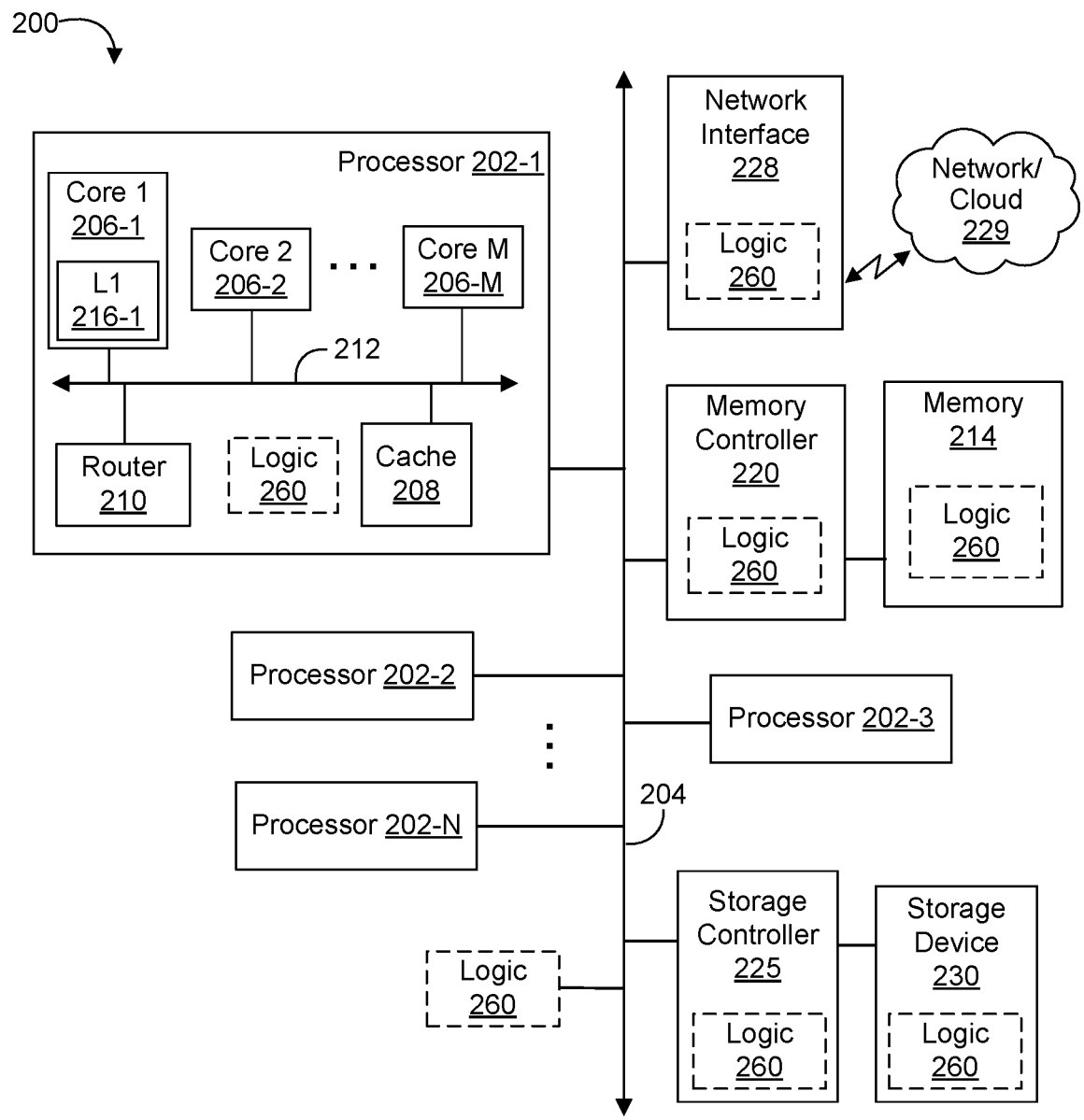
FIG. 11 is a block diagram of an example of a computing system according to an embodiment.

Turning now to FIG. 11, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), logic 260, memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 11, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 11, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a SSD 230 coupled to the interconnect 204 via SSD controller 225. Hence, controller 225 may control access by various components of system 200 to the SSD 230. Furthermore, even though controller 225 is shown to be directly coupled to the interconnection 204 in FIG. 11, controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, controller 225 may be incorporated into memory controller logic or provided on a same integrated circuit (IC) device in various embodiments (e.g., on the same circuit board device as the SSD 230 or in the same enclosure as the SSD 230).

Furthermore, controller 225 and/or SSD 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, SSD 230, SSD bus, SATA bus, controller 225, logic 260, etc., to sense variations in various factors affecting power/thermal behavior of the system/platform, such as temperature, operating frequency, operating voltage, power consumption, and/or inter-core communication activity, etc.

As shown in FIG. 11, features or aspects of the logic 260 may be distributed throughout the system 200, and/or co-located/integrated with various components of the system 200. Any aspect of the system 200 that may require or benefit from error correction technology may include the logic 260. For example, the processor(s) 202, the memory 214, the memory controller 220, the storage controller 225, and the network interface 228 may each include logic 260, which may be in the same enclosure as the system 200 and/or fully integrated on a printed circuit board (PCB) of the system 200. Advantageously, the logic 260 may include technology to implement one or more aspects of the system 10 (FIG. 1), the apparatus 15 (FIG. 2), the method 20 (FIGS. 3A to 3C), the Tanner graph 40 (FIG. 4), the process flow 60 (FIG. 6), the process flow 70 (FIG. 7), the decoder 82 (FIG. 8A), the decoder 84 (FIG. 8B), the decoder 86 (FIG. 8C), the process flow 90 (FIG. 9), the process flow 100 (FIG. 10), and/or any of the dynamic self-correction features discussed herein. The system 200 may include further logic 260 and located outside of the foregoing components.

In some embodiments, the logic 260 may be configured to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability. For example, the logic 260 may be configured to increase a reliability factor of reliable messages sent from the check nodes to the variables nodes and keep unreliable messages sent from the check nodes to the variables nodes unchanged to reduce the influence of the unreliable messages sent from the check nodes to the variable nodes, and/or to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

In some embodiments, the logic 260 may be further configured to calculate a first message to be sent from a first check node to a first variable node in association with the error correction operation, determine a first reliability confidence value for the first message, and adjust a value of the first message based on the determined first reliability confidence value. The logic 260 may also be configured to calculate a second message to be sent from a second variable node to a second check node in association with the error correction operation, determine a second reliability confidence value for the second message, and adjust a value of the second message based on the determined second reliability confidence value. For example, the logic 260 may be configured to compare respective current hard decision values of the calculated first and second messages with corresponding prior hard decision values from a previous iteration to determine the respective first and second reliability confidence values. In some embodiments, the error correction operation may correspond to a NB-LDPC operation, and the reliability factor may correspond to a LDR reliability value. Alternatively, in some embodiments the error correction operation may correspond to a binary LDPC operation, and the reliability factor may correspond to a LLR reliability value.

Additional Notes and Examples

Example 1 includes an electronic apparatus, comprising one or more substrates, and logic coupled to the one or more substrates, the logic to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability.

Example 2 includes the apparatus of Example 1, wherein the logic is further to increase a reliability factor of reliable messages sent from the check nodes to the variables nodes and keep unreliable messages sent from the check nodes to the variables nodes unchanged to reduce the influence of the unreliable messages sent from the check nodes to the variable nodes.

Example 3 includes the apparatus of any of Examples 1 to 2, wherein the logic is further to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

Example 4 includes the apparatus of any of Examples 1 to 3, wherein the logic is further to calculate a message to be sent from a check node to a variable node in association with the error correction operation, determine a reliability confidence value for the message, and adjust a value of the message based on the determined reliability confidence value.

Example 5 includes the apparatus of any of Examples 1 to 4, wherein the logic is further to calculate a message to be sent from a variable node to a check node in association with the error correction operation, determine a reliability confidence value for the message, and adjust a value of the message based on the determined reliability confidence value.

Example 6 includes the apparatus of Example 1, wherein the logic is further to calculate a first message to be sent from a first check node to a first variable node in association with the error correction operation, determine a first reliability confidence value for the first message, adjust a value of the first message based on the determined first reliability confidence value, to calculate a second message to be sent from a second variable node to a second check node in association with the error correction operation, determine a second reliability confidence value for the second message, adjust a value of the second message based on the determined second reliability confidence value, and compare respective current hard decision values of the calculated first and second messages with corresponding prior hard decision values from a previous iteration to determine the respective first and second reliability confidence values.

Example 7 includes the apparatus of any of Examples 1 to 6, wherein the error correction operation corresponds to a non-binary low density parity check operation.

Example 8 includes the apparatus of Example 7, wherein the reliability factor corresponds to a log-density ratio reliability value.

Example 9 includes the apparatus of any of Examples 1 to 6, wherein the error correction operation corresponds to a binary low density parity check operation.

Example 10 includes the apparatus of Example 9, wherein the reliability factor corresponds to a log-likelihood ratio reliability value.

Example 11 includes an electronic system, comprising memory, a controller to control access to the memory, and logic communicatively coupled to the controller and the memory, the logic to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability.

Example 12 includes the system of Example 11, wherein the logic is further to increase a reliability factor of reliable messages sent from the check nodes to the variables nodes and keep unreliable messages sent from the check nodes to the variables nodes unchanged to reduce the influence of the unreliable messages sent from the check nodes to the variable nodes.

Example 13 includes the system of any of Examples 11 to 12, wherein the logic is further to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

Example 14 includes the system of any of Examples 11 to 13, wherein the logic is further to calculate a first message to be sent from a first check node to a first variable node in association with the error correction operation, determine a first reliability confidence value for the first message, and adjust a value of the first message based on the determined first reliability confidence value.

Example 15 includes the system of Example 14, wherein the logic is further to calculate a second message to be sent from a second variable node to a second check node in association with the error correction operation, determine a second reliability confidence value for the second message, and adjust a value of the second message based on the determined second reliability confidence value.

Example 16 includes the system of Example 15, wherein the logic is further to compare respective current hard decision values of the calculated first and second messages with corresponding prior hard decision values from a previous iteration to determine the respective first and second reliability confidence values.

Example 17 includes the system of any of Examples 11 to 16, wherein the error correction operation corresponds to a non-binary low density parity check operation.

Example 18 includes the system of Example 17, wherein the reliability factor corresponds to a log-density ratio reliability value.

Example 19 includes the system of any of Examples 11 to 16, wherein the error correction operation corresponds to a binary low density parity check operation.

Example 20 includes the system of Example 19, wherein the reliability factor corresponds to a log-likelihood ratio reliability value.

Example 21 includes a method of controlling memory, comprising detecting unreliable messages between check nodes and variable nodes in association with an error correction operation, determining respective degrees of unreliability for the unreliable messages, and reducing an influence of the unreliable messages on the error correction operation, as compared to an influence of reliable messages between the check nodes and the variables nodes, based on the determined respective degrees of unreliability.

Example 22 includes the method of Example 21, further comprising increasing a reliability factor of reliable messages sent from the check nodes to the variables nodes and keep unreliable messages sent from the check nodes to the variables nodes unchanged to reduce the influence of the unreliable messages sent from the check nodes to the variable nodes.

Example 23 includes the method of any of Examples 21 to 22, further comprising reducing a reliability factor of unreliable messages sent from the variable nodes to the check nodes and keep the reliable messages sent from the variable nodes to the check nodes unchanged to reduce the influence of unreliable messages sent from the variable nodes to the check nodes.

Example 24 includes the method of any of Examples 21 to 23, further comprising calculating a first message to be sent from a first check node to a first variable node in association with the error correction operation, determining a first reliability confidence value for the first message, and adjusting a value of the first message based on the determined first reliability confidence value.

Example 25 includes the method of Example 24, further comprising calculating a second message to be sent from a second variable node to a second check node in association with the error correction operation, determining a second reliability confidence value for the second message, and adjusting a value of the second message based on the determined second reliability confidence value.

Example 26 includes the method of Example 25, further comprising comparing respective current hard decision values of the calculated first and second messages with corresponding prior hard decision values from a previous iteration to determine the respective first and second reliability confidence values.

Example 27 includes the method of any of Examples 21 to 26, wherein the error correction operation corresponds to a non-binary low density parity check operation.

Example 28 includes the method of Example 27, wherein the reliability factor corresponds to a log-density ratio reliability value.

Example 29 includes the method of any of Examples 21 to 26, wherein the error correction operation corresponds to a binary low density parity check operation.

Example 30 includes the method of Example 29, wherein the reliability factor corresponds to a log-likelihood ratio reliability value.

Example 31 includes at least one non-transitory machine readable medium comprising a plurality of instructions that, in response to being executed on a computing device, cause the computing device to detect unreliable messages between check nodes and variable nodes in association with an error correction operation, determine respective degrees of unreliability for the unreliable messages, and reduce an influence of the unreliable messages on the error correction operation, as compared to an influence of reliable messages between the check nodes and the variables nodes, based on the determined respective degrees of unreliability.

Example 32 includes the at least one non-transitory machine readable medium of Example 31, comprising a plurality of further instructions that, in response to being executed on the computing device, cause the computing device to increase a reliability factor of reliable messages sent from the check nodes to the variables nodes and keep unreliable messages sent from the check nodes to the variables nodes unchanged to reduce the influence of the unreliable messages sent from the check nodes to the variable nodes.

Example 33 includes the at least one non-transitory machine readable medium of any of Examples 31 to 32, comprising a plurality of further instructions that, in response to being executed on the computing device, cause the computing device to reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

Example 34 includes the at least one non-transitory machine readable medium of any of Examples 31 to 33, comprising a plurality of further instructions that, in response to being executed on the computing device, cause the computing device to calculate a first message to be sent from a first check node to a first variable node in association with the error correction operation, determine a first reliability confidence value for the first message, and adjust a value of the first message based on the determined first reliability confidence value.

Example 35 includes the at least one non-transitory machine readable medium of Example 34, comprising a plurality of further instructions that, in response to being executed on the computing device, cause the computing device to calculate a second message to be sent from a second variable node to a second check node in association with the error correction operation, determine a second reliability confidence value for the second message, and adjust a value of the second message based on the determined second reliability confidence value.

Example 36 includes the at least one non-transitory machine readable medium of Example 35, comprising a plurality of further instructions that, in response to being executed on the computing device, cause the computing device to compare respective current hard decision values of the calculated first and second messages with corresponding prior hard decision values from a previous iteration to determine the respective first and second reliability confidence values.

Example 37 includes the at least one non-transitory machine readable medium of any of Examples 31 to 36, wherein the error correction operation corresponds to a non-binary low density parity check operation.

Example 38 includes the at least one non-transitory machine readable medium of Example 37, wherein the reliability factor corresponds to a log-density ratio reliability value.

Example 39 includes the at least one non-transitory machine readable medium of any of Examples 31 to 36, wherein the error correction operation corresponds to a binary low density parity check operation.

Example 40 includes the at least one non-transitory machine readable medium of Example 39, wherein the reliability factor corresponds to a log-likelihood ratio reliability value.

Example 41 includes a memory controller apparatus, comprising means for detecting unreliable messages between check nodes and variable nodes in association with an error correction operation, means for determining respective degrees of unreliability for the unreliable messages, and means for reducing an influence of the unreliable messages on the error correction operation, as compared to an influence of reliable messages between the check nodes and the variables nodes, based on the determined respective degrees of unreliability.

Example 42 includes the apparatus of Example 41, further comprising means for increasing a reliability factor of reliable messages sent from the check nodes to the variables nodes and keep unreliable messages sent from the check nodes to the variables nodes unchanged to reduce the influence of the unreliable messages sent from the check nodes to the variable nodes.

Example 43 includes the apparatus of any of Examples 41 to 42, further comprising means for reducing a reliability factor of unreliable messages sent from the variable nodes to the check nodes and keep the reliable messages sent from the variable nodes to the check nodes unchanged to reduce the influence of unreliable messages sent from the variable nodes to the check nodes.

Example 44 includes the apparatus of any of Examples 41 to 43, further comprising means for calculating a first message to be sent from a first check node to a first variable node in association with the error correction operation, means for determining a first reliability confidence value for the first message, and means for adjusting a value of the first message based on the determined first reliability confidence value.

Example 45 includes the apparatus of Example 44, further comprising means for calculating a second message to be sent from a second variable node to a second check node in association with the error correction operation, means for determining a second reliability confidence value for the second message, and means for adjusting a value of the second message based on the determined second reliability confidence value.

Example 46 includes the apparatus of Example 45, further comprising means for comparing respective current hard decision values of the calculated first and second messages with corresponding prior hard decision values from a previous iteration to determine the respective first and second reliability confidence values.

Example 47 includes the apparatus of any of Examples 41 to 46, wherein the error correction operation corresponds to a non-binary low density parity check operation.

Example 48 includes the apparatus of Example 47, wherein the reliability factor corresponds to a log-density ratio reliability value.

Example 49 includes the apparatus of any of Examples 41 to 46, wherein the error correction operation corresponds to a binary low density parity check operation.

Example 50 includes the apparatus of Example 49, wherein the reliability factor corresponds to a log-likelihood ratio reliability value.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled

What is claimed is:

1. An electronic apparatus, comprising:
   one or more substrates; and
   logic coupled to the one or more substrates, the logic to:
      detect unreliable messages between check nodes and variable nodes in association with an error correction operation;
      determine respective degrees of unreliability for the unreliable messages; and
      reduce an influence of the unreliable messages on the error correction operation, as compared to an influence of reliable messages between the check nodes and the variables nodes, based on the determined respective degrees of unreliability;
   wherein:
      the logic to detect the unreliable messages comprises the logic to determine a first reliability confidence value, associated with a first message, based on a comparison of a first hard decision value and a second hard decision value;
      the first hard decision value is based on an identification of a respective maximum value of a first log-density ratio (LDR) vector which is communicated, in a first iteration of multiple iterations of a decode algorithm, via a first edge between a first node of a decoder and a second node of a decoder; and
      the second hard decision value is based on an identification of a respective maximum value of a second LDR vector which is communicated, via the first edge, in a second iteration of the multiple iterations, the second iteration after the first iteration.

2. The electronic apparatus of claim 1, wherein the logic is further to:
   increase a reliability factor of reliable messages sent from the check nodes to the variables nodes and keep unreliable messages sent from the check nodes to the variables nodes unchanged to reduce the influence of the unreliable messages sent from the check nodes to the variable nodes.

3. The electronic apparatus of claim 1, wherein the logic is further to:
reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

4. The electronic apparatus of claim 1, wherein the logic is further to:
calculate a second message to be sent from a check node to a variable node in association with the error correction operation;
determine a second reliability confidence value for the second message; and
adjust a value of the second message based on the second reliability confidence value.

5. The electronic apparatus of claim 1, wherein the logic is further to:
calculate a second message to be sent from a variable node to a check node in association with the error correction operation;
determine a second reliability confidence value for the second message; and
adjust a value of the second message based on the second reliability confidence value.

6. The electronic apparatus of claim 1, wherein the logic is further to:
calculate a second message to be sent from a first check node to a first variable node in association with the error correction operation;
determine a second reliability confidence value for the second message;
adjust a value of the second message based on the second reliability confidence value;
calculate a third message to be sent from a second variable node to a second check node in association with the error correction operation;
determine a third reliability confidence value for the third message;
adjust a value of the third message based on the third reliability confidence value; and
compare respective current hard decision values of the calculated second and third messages with corresponding prior hard decision values from a previous iteration to determine the respective second and third reliability confidence values.

7. The electronic apparatus of claim 1, wherein the error correction operation corresponds to a non-binary low density parity check operation.

8. An electronic system, comprising:
memory;
a controller to control access to the memory; and
logic communicatively coupled to the controller and the memory, the logic to:
detect unreliable messages between check nodes and variable nodes in association with an error correction operation;
determine respective degrees of unreliability for the unreliable messages; and
reduce an influence of the unreliable messages on the error correction operation, as compared to an influence of reliable messages between the check nodes and the variables nodes, based on the determined respective degrees of unreliability;

wherein:
the logic to detect the unreliable messages comprises the logic to determine a first reliability confidence value, associated with a first message, based on a comparison of a first hard decision value and a second hard decision value;
the first hard decision value is based on an identification of a respective maximum value of a first log-density ratio (LDR) vector which is communicated, in a first iteration of multiple iterations of a decode algorithm, via a first edge between a first node of a decoder and a second node of a decoder; and
the second hard decision value is based on an identification of a respective maximum value of a second LDR vector which is communicated, via the first edge, in a second iteration of the multiple iterations, the second iteration after the first iteration.

9. The electronic system of claim 8, wherein the logic is further to:
increase a reliability factor of reliable messages sent from the check nodes to the variables nodes and keep unreliable messages sent from the check nodes to the variables nodes unchanged to reduce the influence of the unreliable messages sent from the check nodes to the variable nodes.

10. The electronic system of claim 9, wherein the logic is further to:
reduce a reliability factor of unreliable messages sent from the variable nodes to the check nodes and keep the reliable messages sent from the variable nodes to the check nodes unchanged to reduce the influence of unreliable messages sent from the variable nodes to the check nodes.

11. The electronic system of claim 8, wherein the logic is further to:
calculate a second message to be sent from a first check node to a first variable node in association with the error correction operation;
determine a second reliability confidence value for the second message; and
adjust a value of the second message based on the second reliability confidence value.

12. The electronic system of claim 11, wherein the logic is further to:
calculate a third message to be sent from a second variable node to a second check node in association with the error correction operation;
determine a third reliability confidence value for the third message; and
adjust a value of the third message based on the third reliability confidence value.

13. The electronic system of claim 12, wherein the logic is further to:
compare respective current hard decision values of the calculated second and third messages with corresponding prior hard decision values from a previous iteration to determine the respective second and third reliability confidence values.

14. The electronic system of claim 12, wherein the error correction operation corresponds to a non-binary low density parity check operation, and wherein the reliability factor corresponds to a log-density ratio reliability value.

15. A method of controlling memory, the method comprising:
detecting unreliable messages between check nodes and variable nodes in association with an error correction operation;

determining respective degrees of unreliability for the unreliable messages; and reducing an influence of the unreliable messages on the error correction operation, as compared to an influence of reliable messages between the check nodes and the variables nodes, based on the determined respective degrees of unreliability;

wherein:

detecting the unreliable messages comprises determining a first reliability confidence value, associated with a first message, based on a comparison of a first hard decision value and a second hard decision value;

the first hard decision value is based on an identification of a respective maximum value of a first log-density ratio (LDR) vector which is communicated, in a first iteration of multiple iterations of a decode algorithm, via a first edge between a first node of a decoder and a second node of a decoder; and wherein the second hard decision value is based on an identification of a respective maximum value of a second LDR vector which is communicated, via the first edge, in a second iteration of the multiple iterations, the second iteration after the first iteration.

16. The method of claim 15, further comprising:

increasing a reliability factor of reliable messages sent from the check nodes to the variables nodes and keep unreliable messages sent from the check nodes to the variables nodes unchanged to reduce the influence of the unreliable messages sent from the check nodes to the variable nodes.

17. The method of claim 15, further comprising:

reducing a reliability factor of unreliable messages sent from the variable nodes to the check nodes and keep the reliable messages sent from the variable nodes to the check nodes unchanged to reduce the influence of unreliable messages sent from the variable nodes to the check nodes.

18. The method of claim 15, further comprising:

calculating a second message to be sent from a first check node to a first variable node in association with the error correction operation;

determining a second reliability confidence value for the second message; and adjusting a value of the second message based on the second reliability confidence value.

19. The method of claim 18, further comprising:

calculating a third message to be sent from a second variable node to a second check node in association with the error correction operation;

determining a third reliability confidence value for the third message; and adjusting a value of the third message based on the third reliability confidence value.

20. The method of claim 19, further comprising:

comparing respective current hard decision values of the calculated second and third messages with corresponding prior hard decision values from a previous iteration to determine the respective second and third reliability confidence values.

\* \* \* \* \*